United States Patent [19]

Sakai

[11] Patent Number: 4,517,508
[45] Date of Patent: May 14, 1985

[54] VARIABLE IMPEDANCE CIRCUIT

[75] Inventor: Koichi Sakai, Tokyo, Japan

[73] Assignee: Toko, Inc., Tokyo, Japan

[21] Appl. No.: 491,210

[22] Filed: May 3, 1983

[30] Foreign Application Priority Data

May 8, 1982 [JP] Japan .................................. 57-77330
May 31, 1982 [JP] Japan .................................. 57-92339

[51] Int. Cl.³ ............................................ H03H 11/00
[52] U.S. Cl. .................................. 323/352; 307/264; 323/315
[58] Field of Search ............... 323/315, 352; 307/264, 307/564; 330/296; 333/14

[56] References Cited

U.S. PATENT DOCUMENTS

| 4,066,914 | 1/1978 | Gundry | 323/352 |
| 4,179,650 | 12/1979 | Fukushima et al. | 323/315 |
| 4,220,875 | 9/1980 | Lawton | 323/352 |
| 4,288,707 | 9/1981 | Katakura | 323/352 |
| 4,339,677 | 7/1982 | Hoeft | 323/352 |

FOREIGN PATENT DOCUMENTS

| 2350718 | 4/1975 | Fed. Rep. of Germany | 323/315 |
| 2517174 | 10/1976 | Fed. Rep. of Germany | 323/315 |
| 121044 | 9/1979 | Japan | 307/264 |

Primary Examiner—William H. Beha, Jr.

[57] ABSTRACT

A variable impedance circuit is disclosed which comprises a pair of diodes having their cathodes connected together, a first current source coupled to the connection between the diodes, and a second and a third current source which are connected to the anodes of the diodes respectively. The second and third current sources are controlled by means of current mirror circuits so that equal forward currents are caused to flow therefrom to the paired diodes, thus making it possible to set up a desired impedance variation range.

2 Claims, 9 Drawing Figures

FIG. I
PRIOR ART
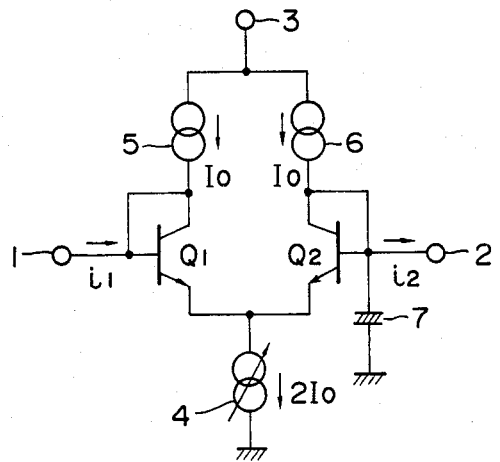
FIG. 2
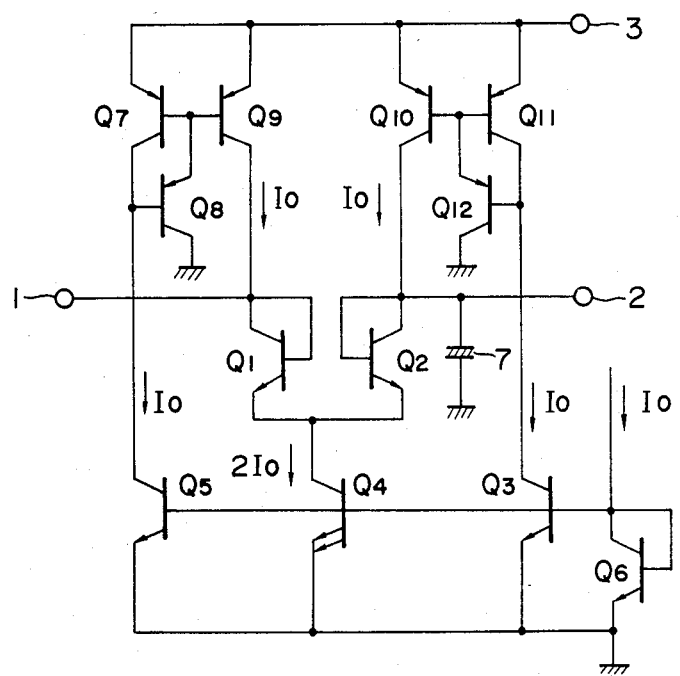

VARIABLE IMPEDANCE CIRCUIT

BACKGROUND OF THE INVENTION

1. Field of the Invention

This invention relates to a variable impedance circuit device whose impedance can be varied by means of electric control, and more particularly it pertains to such a circuit device which is so designed that the impedance thereof can be varied over a wide range.

2. Description of the Prior Art

In order to have a better understanding of the present invention, reference will first be made to FIG. 1 of the accompanying drawings, which illustrates a conventional variable impedance circuit which comprises diode-connected transistors $Q_1$ and $Q_2$. The illustrated circuit arrangement includes an input terminal 1, a terminal 2 to which is applied a reference voltage, a power supply terminal 3, and current source circuits 5 and 6. The transistors $Q_1$ and $Q_2$ have the emitters thereof connected together and to a variable current source 4. With such a circuit arrangement, by changing a control voltage applied to the variable current source 4 to cause a variable current to flow through each of the diode-connected transistors $Q_1$ and $Q_2$, a variable impedance element is provided between the terminals 1 and 2. Indicated at 7 is a by-pass capacitor. More specifically, in the circuit arrangement shown in FIG. 1, equal bias currents $I_0$ flow through the current sources 5 and 6 which are connected to the collectors of the transistors $Q_1$ and $Q_2$ respectively so that a current $2I_0$ flows through the current source 4 connected to the emitters of these transistors. When a signal source is connected to the terminal 1, an input current $i_1$ flows in the circuit, and an output current $i_2$ flows out of it. Under such a condition, the relationship $i_1 = i_2$ holds true. Instantaneous input voltage $V_R$ applied to the terminal 1 is equal to the difference between base-emitter voltages $V_{BE1}$ and $V_{BE2}$ of the transistors $Q_1$ and $Q_2$ respectively. Assuming that a current $i_R$ is generated on the basis of the instantaneous input voltage $V_R$, then the relationship $i_R = i_1 = i_2$ holds true. Thus, the instantaneous input voltage $V_R$ is given by the following expression:

$$V_R = V_{BE1} - V_{BE2} \tag{1}$$

$$= V_T \left( \ln \frac{I_0 + i_R}{I_s} - \ln \frac{I_0 - i_R}{I_s} \right)$$

$$= V_T \ln \frac{1 + \frac{i_R}{I_0}}{1 - \frac{i_R}{I_0}} = V_T \ln \frac{I_0 + i_R}{I_0 - i_R}$$

where $V_T = KT/q$; $I_S$ is saturation current; K is Boltzmann's constant; T is absolute temperature; and q is electron charge. As will be seen from Equation (1), the instantaneous input voltage $V_R$ depends on the input current $i_1$ flowing in the terminal 1, and the factor thereof can be controlled by means of the equal bias currents $I_0$. In a small signal range, the impedance R between the terminals 1 and 2 can be determined by differentiating Equation (1) in terms of $i_R$ and seeking the gradient of a tangential line with $i_R = 0$, and given as follows:

$$R = \left. \frac{dV_R}{di_R} \right|_{i_R = 0} = 2 \frac{KT}{qI_0} \tag{2}$$

From Equation (2), it will be seen that the impedance R can be proportionally controlled on the basis of the bias currents $I_0$ which are variable d.c. currents.

However, the foregoing prior-art circuit arrangement is disadvantageous in that since equally controlled variable d.c. currents are applied to the diode-connected transistors $Q_1$ and $Q_2$ to cause the bias currents to flow therethrough, there is the tendency that if the equilibrium between the variable d.c. voltages is disturbed, then a current is flown in or drawn in through the terminal 1 or 2 so that the d.c. bias for each of the transistors is suddenly changed, thus imparting distortion to the input signal $i_1$ which is inputted through the terminal 1. Thus, if the aforementioned prior-art variable impedance circuit arrangement is employed as a noise suppressor circuit, gain control circuit or the like for a radio receiver, then pop noise will disadvantageously be caused due to the sudden d.c. bias changes.

Another disadvantage is such that in the case where the variable current source 4 is comprised of a transistor, it is not possible to flow the control current $I_0$ by the use of a control voltage lower than about 0.6 V, i.e., the base-emitter voltage of the transistor. In other words, in such a case, the impedance of the circuit shown in FIG. 1 cannot be varied with a control voltage in the range of 0 to 0.6 V or less. Obviously, in the case where the bias circuit for the transistor source 4 is comprised of two diodes connected in series with each other, the impedance cannot be varied with a control voltage lower than about 1.2 V. Thus, the prior-art circuit arrangement shown in FIG. 1 has such a drawback that in the case where the power source voltage $V_{CC}$ is less than 1.8 V, a sufficient quantity of the control current $I_0$ cannot be flown with a control voltage in the range of 0 to 1.2 V so that the impedance of the circuit can only be varied over a narrow range.

SUMMARY OF THE INVENTION

The present invention is directed to providing a variable impedance circuit which is constructed by the use of elements such as bipolar transistors which can conveniently be incorporated in an integrated circuit, instead of by resorting to the use of field effect transistors.

It is an object of the present invention to provide a variable impedance circuit including a pair of diode-connected transistors or diodes, wherein d.c. potential is prevented from being changed, by flowing equal bias currents through the transistors or diodes.

Another object of the present invention is to provide a variable impedance circuit whose impedance can be varied over a wide range.

Still another object of the present invention is to provide a variable impedance circuit including a pair of PN junctions, wherein the impedance between the input and output terminals of the circuit can be varied over a wide range by flowing a small current through the PN junction pair, thereby preventing distortion from being imparted to signals.

Yet another object of the present invention is to provide a variable impedance circuit which is applicable to recently developed audio devices which can be driven with a power source voltage of 1.8 V or less.

The variable impedance circuit according to the present invention is intended to achieve the foregoing objects.

Other objects, features and advantages of the present invention will become apparent from the ensuing description taken in conjunction with the accompanying drawings.

BRIEF DESCRIPTION OF THE DRAWINGS

FIG. 1 is a circuit diagram illustrating a conventional variable impedance circuit.

FIGS. 2 to 5 are circuit diagrams showing embodiments of the present invention, respectively.

DESCRIPTION OF THE PREFERRED EMBODIMENTS

Figure 3:
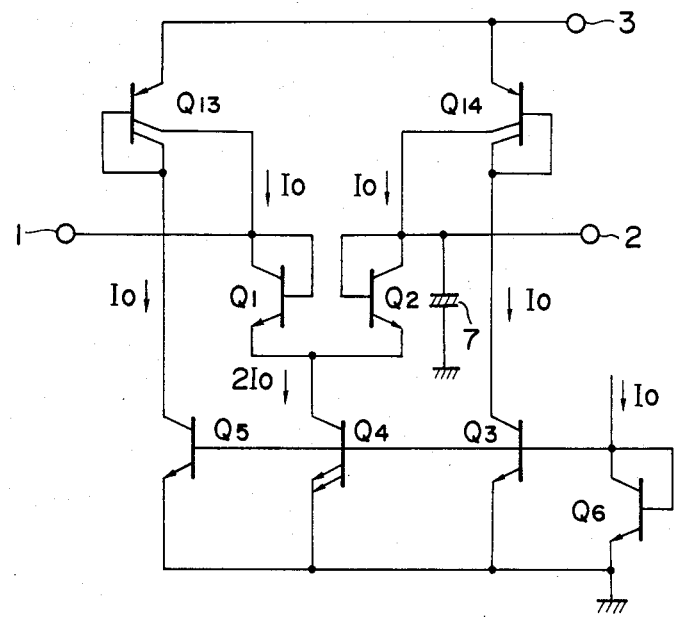

The present invention will now be described with respect to embodiments thereof which are shown in FIGS. 2 to 9 wherein similar parts are indicated by like reference numerals and symbols.

Referring first to FIG. 2, there is shown the variable impedance circuit according to a first embodiment of the present invention, which includes a pair of diode-connected transistors $Q_1$ and $Q_2$. A transistor $Q_4$ constitutes a current source circuit and has the collector thereof connected to the emitters of transistors $Q_1$ and $Q_2$. A transistor $Q_9$ is connected between a terminal 3 and the collector of the transistor $Q_1$ and constitutes, together with transistors $Q_7$ and $Q_8$, a first current mirror circuit. Connected between the transistor $Q_2$ and the terminal 3 is a transistor $Q_{10}$ which constitutes, together with transistors $Q_{11}$ and $Q_{12}$, a second current mirror circuit. Transistors $Q_3$ to $Q_6$ constitute a third current mirror circuit serving as current source circuit. The third current mirror circuit is coupled to the first and second current mirror circuits, whereby the bias currents of the diode-connected transistors $Q_1$ and $Q_2$ are controlled. By flowing variable current $I_0$ through the collector of the transistor $Q_6$, a collector current, which is equal to the variable current $I_0$, is caused to flow through each of the transistors $Q_3$ and $Q_5$. The emitter area of the transistor $Q_4$ is made twice as large as those of the transistor $Q_3$, $Q_5$ and $Q_6$; thus, a variable current of $2I_0$ is caused to flow through the transistor $Q_4$. The collector of the transistor $Q_5$ is connected to the bias side of the first current mirror circuit, so that variable current $I_0$ is caused to flow as collector current of the transistor $Q_9$ provided at the output side of the first current mirror circuit. The second mirror circuit has the bias side thereof connected to the collector electrode of the transistor $Q_3$ of the third mirror circuit, so that variable current $I_0$ is caused to flow as collector current of the transistor $Q_{10}$ provided at the output side of the second current mirror circuit. Thus, the variable currents $I_0$ which forwardly flow through the diode-connected transistors $Q_1$ and $Q_2$ turn out equal to each other. Indicated at 7 is a by-pass capacitor.

Referring to FIG. 3, there is shown the variable impedance circuit according to a second embodiment of the present invention, which is similar to the circuit arrangement shown in FIG. 2, except that the first and second current mirror circuits are formed by current source circuits comprising multi-collector type transistors $Q_{13}$ and $Q_{14}$ respectively.

Figure 4:
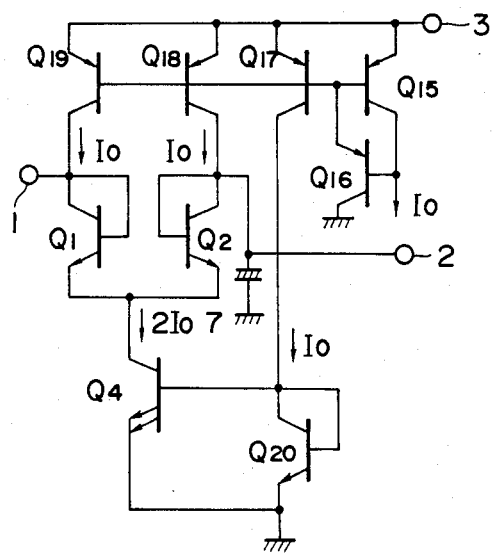

FIG. 4 shows a third embodiment of the present invention, wherein a single current mirror circuit constituted by transistor $Q_{15}$ to $Q_{19}$ is provided in place of the first and second current mirror circuits provided in the embodiment shown in FIG. 2.

Figure 5:
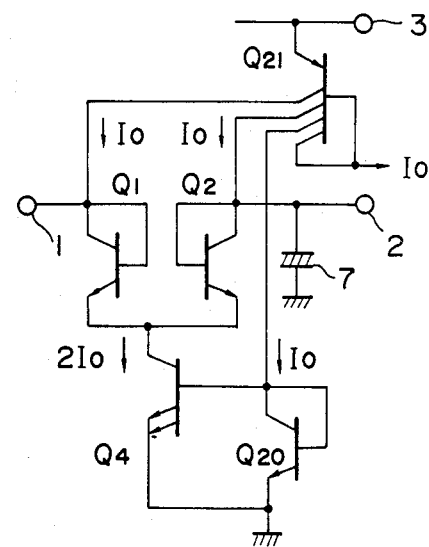

FIG. 5 shows a fourth embodiment of the present invention, wherein there is provided a current source circuit which is constituted by a current mirror circuit comprisisng a multi-collector type transistor $Q_{21}$. Transistors $Q_4$ and $Q_{20}$ constitute a current mirror circuit, the transistor $Q_4$ having an emitter area twice as large as that of the transistor $Q_{20}$.

As will be appreciated from the foregoing description, according to the present invention, by flowing forward current $I_0$ in each of the diode-connected transistors, with the aid of current mirror circuits, it is possible to cause equal forward currents $I_0$ to flow through the transistors. The current mirror circuits may selectively take various forms such as shown in FIGS. 2 to 5, depending on the type of circuit arrangement in which they are used.

With the above-mentioned impedance circuit according to the present invention, by changing variable current $I_0$ in the range of 1 $\mu$A to 1 mA, the impedance R between the terminals 1 and 2 is represented as $R = 2KT/qI_0$ as will be seen from Equation (2). KT/q is about 26 mV at 25° C.; thus, when a current of 1 $\mu$A is caused to flow as variable current $I_0$, the impedance R turns out to be about 50 K$\Omega$, and when a current of 1 mA is caused to flow as variable current $I_0$, the impedance R turns out to be about 50$\Omega$. In this way, the value of the impedance R can freely be set in such a range.

As will also be appreciated, with the variable impedance circuits shown in FIGS. 2 to 5, forward currents $I_0$ flowing through the diode-connected transistors can freely be controlled on the basis of a control voltage, with the aid of the current mirror circuits. Generally, in the case where the power source voltage $V_{CC}$ is as low as 1.8 V, the control voltage also becomes low, and thus in such a case, the impedance of the variable impedance circuit can only be controlled in a limited range, or in a worse case, the impedance can no longer be controlled.

Figure 7:
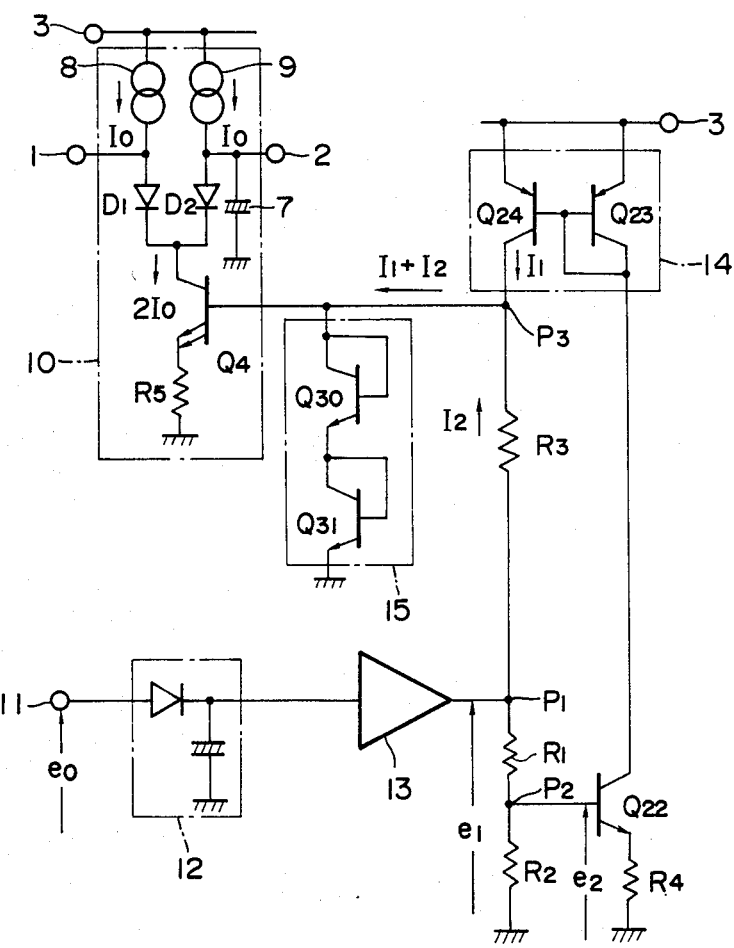
FIGS. 7 to 9 are circuit diagrams showing further embodiments of the present invention, respectively.
Figure 8:
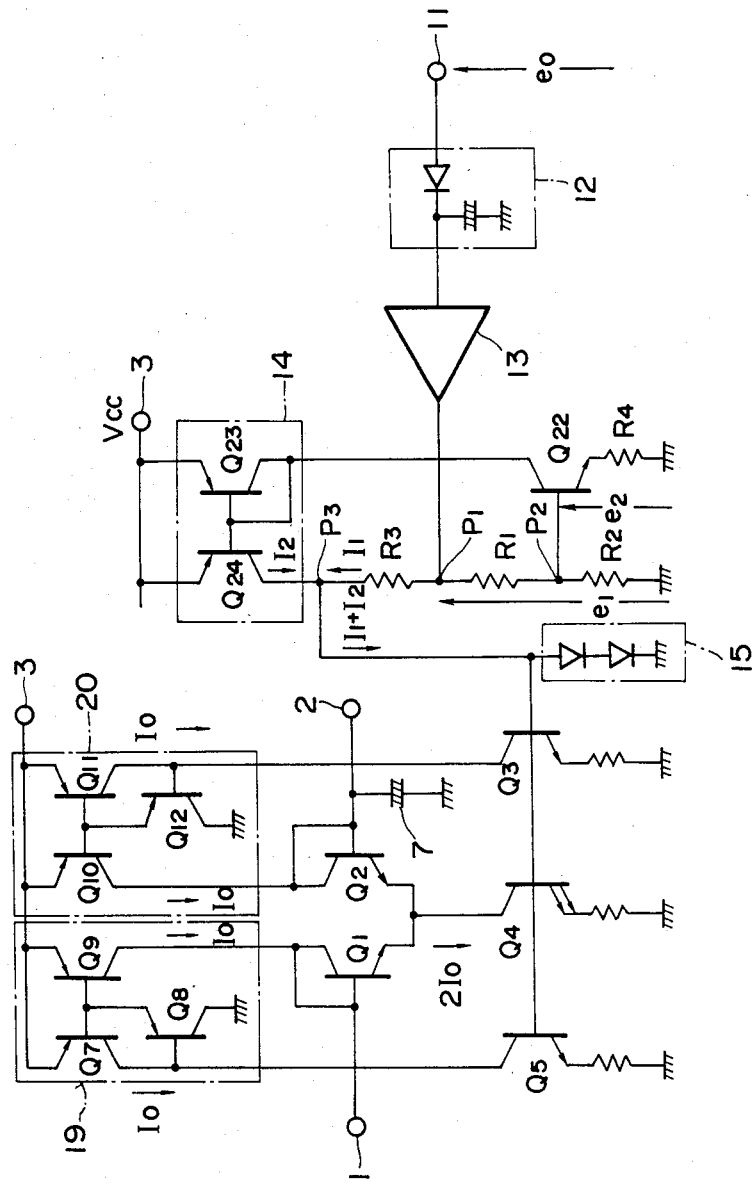
Figure 9:
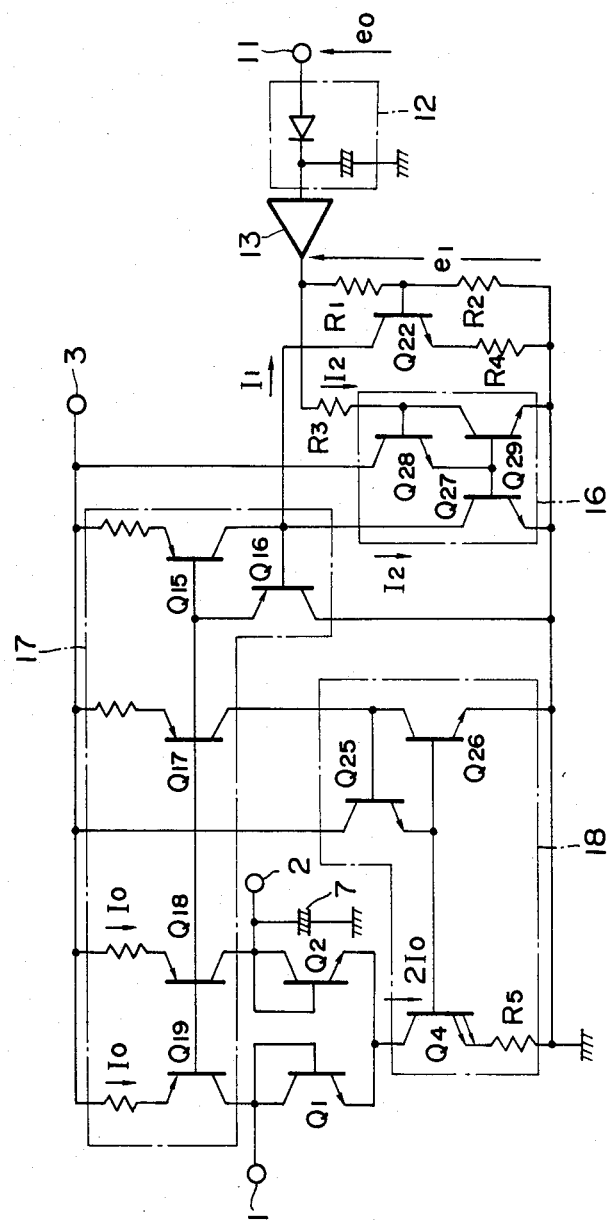

In order to eliminate such a drawback, according to the present invention, there are also provided variable impedance circuits such as shown in FIGS. 7 to 9, each of which is so designed that the impedance thereof can be controlled even with a low power source voltage.

Each of the variable impedance circuits shown in FIGS. 7 to 9 includes two current source circuit systems, wherein variable currents derived from the two current source systems are superimposed upon each other and then supplied to a current mirror circuit which is arranged to control the bias current of the variable impedance circuit, thereby making variable the impedance of the circuit.

The variable impedance circuit shown at 10 in FIG. 7 comprises diodes $D_1$, $D_2$, current sources 8, 9, a current source transistor $Q_4$, and an emitter resistor $R_5$. Indicated at 11 is an input terminal to which an audio signal is inputted. A rectifier circuit 12 is provided which comprises a diode and smoothing capacitor and which may take the form of a full-wave rectifier. A buffer amplifier 13 is provided, and divider resistors $R_1$ and $R_2$ are connected in series between the output terminal $P_1$ of the buffer amplifier 13 and ground. The connection point $P_2$ between the resistors $R_1$ and $R_2$ is coupled to the base of a transistor $Q_{22}$; a resistor $R_4$ is connected to the emitter of the transistor $Q_{22}$; and the collector of the transistor $Q_{22}$ is tied to the collector of a transistor $Q_{23}$. A current mirror circuit 14 is constituted by the transistor $Q_{23}$ and a transistor $Q_{24}$, and a resistor $R_3$ is connected between the collector of the transistor $Q_{24}$ and the connection point $P_1$. A bias circuit 15 which comprises diode-connected transistors $Q_{30}$, $Q_{31}$ is connected between ground and the connection point $P_3$ between the transistor $Q_{24}$ and the resistor $R_3$. The connection point $P_3$ is coupled to the base of the current source transistor $Q_4$.

A signal voltage $e_0$ such as audio signal or the like, which is applied to a terminal 11, is rectified and smoothed by the rectifier circuit 12, and then passed through the buffer amplifier 13 to be converted to a variable d.c. control voltage $e_1$ which in turn is applied to the first and second current source circuits. The first current source circuit will first be explained. The variable d.c. control voltage $e_1$ derived from the buffer amplifier 13 is applied across the divider resistors, and when a divided voltage $e_2$ obtained at the connection point $P_2$ between the divider resistors exceeds the threshold level of the transistor $Q_{22}$, the latter is rendered conductive so that variable current $I_1$ is caused to flow as collector current of the transistor $Q_{22}$. The variable current $I_1$ is passed to the bias circuit 15 through the current mirror circuit 14. The transistor $Q_4$ is biased by the bias circuit 15 so that a current proportional to the variable current $I_1$ is caused to flow therethrough. When the variable d.c. control voltage $e_1$ exceeds the threshold level of the bias circuit 15, variable current $I_2$ is caused to flow in the bias circuit 15 through the resistor $R_3$ so that a current proportional to the variable current $I_2$ is caused to flow as collector current of the transistor $Q_4$. In this way, a current $2I_0$ proportional to the currents $I_1$ and $I_2$ is caused to flow in the variable impedance circuit. The threshold voltage of the bias circuit 15 is about 1.2 V since the bias circuit 15 is constituted by the series connection of the diode-connected transistors $Q_{30}$, $Q_{31}$.

As mentioned above, the variable impedance circuit of FIG. 7 includes the first circuit for controlling, in a low current range, the bias currents or forward currents flowing through the diodes $D_1$ and $D_2$; and the second circuit for generating a current when the signal voltage $e_1$ exceeds the threshold voltage of the bias current 15, thereby controlling, in a high current range, the bias currents mentioned above.

Figure 6:
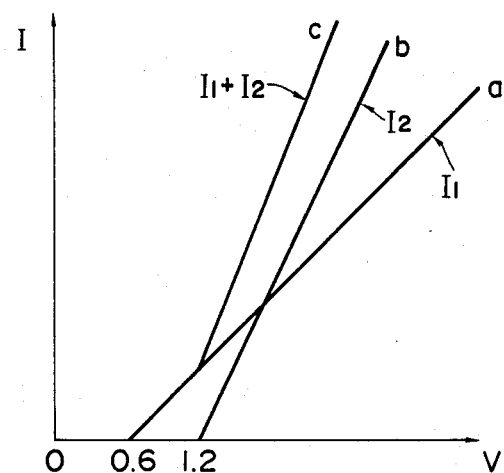
FIG. 6 is a view illustrating the control voltage V - forward current I characteristics of variable impedance circuit.

Reference will now be made to FIG. 6, wherein a straight line a indicates the voltage-current characteristic of the first current source circuit; a straight line b indicates the voltage-current characteristic of the second current source circuit; and a bent line c shows the characteristic of variable current $2I_0$ flowing through the current source transistor $Q_4$ of the variable impedance circuit 10, the variable current $2I_0$ being an output current obtained on the bias of bias current resulting from superimposition of the variable currents $I_1$ and $I_2$ derived from the first and second current source circuits respectively.

Description will now be made of the operation of the variable impedance circuit shown in FIG. 7. A sinusoidal signal $e_0$ such as audio signal or the like is applied to the input terminal 11 and rectified in the rectifier circuit 12 so that a voltage $e_1$, which is substantially smoothed to be d.c., is obtained through the buffer amplifier 13.

The voltage $e_1$ thus obtained is applied to be divided by the divider resistors $R_1$ and $R_2$; thus a divided voltage $e_2$ is obtained. When the divided voltage $e_2$ becomes higher than the base-emitter voltage $V_{BE1}$ of the transistor $Q_{22}$, the latter is turned on so that variable current $I_1$ is caused to flow as collector current of the transistor $Q_{22}$. Further, variable current $I_1$ is caused to flow through the transistor $Q_{23}$ of the current mirror circuit 14, and at the same time variable current $I_1$ is caused to flow as collector current of the transistor $Q_{24}$, which the bias circuit 15. At this point, the current source transistor $Q_4$ is biased by bias voltage generated in the bias circuit 15, so that variable current $2I_0$ proportional to the variable current $I_1$ is caused to flow as collector current of the transistor $Q_4$. The variable current $2I_0$ is given as follows:

$$2I_0 = \frac{V_F - V_{BE}}{R_5} \quad (3)$$

where $V_F$ is the sum of barrier voltages of the diode-connected transistors $Q_{30}$ and $Q_{31}$, and $V_{BE}$ is the base-emitter voltage of the transistor $Q_4$.

When the signal voltage $e_1$ builds up and exceeds the threshold votage (about 1.2 V) of the bias circuit 15, the variable current $I_1$ is added to the variable current $I_1$ and flows in the bias circuit 15. The transistor $Q_4$ is biased by bias voltage generated in the bias circuit 15, and thus a current in proportion to the added variable current $(I_1+I_2)$ is caused to flow as collector current of the transistor $Q_4$. The variable currents $I_1$ and $I_2$ are given by the following equations:

$$I_1 = \frac{1}{R_1}\left(\frac{e_1 R_2}{R_1 + R_2} - V_{BE1}\right) \quad (4)$$

$$I_2 = \frac{1}{R_3}(e_1 - 2V_F) \quad (5)$$

where $V_{BE1}$ is the base-emitter voltage of the transistor $Q_{22}$.

Referring to FIG. 8, there is shown the variable impedance circuit according to a sixth embodiment of the present invention, which is similar to the circuit of FIG. 2 except that a first and a second circuit for obtaining control currents are additionally provided. Transistors $Q_3$, $Q_4$ and $Q_5$ constitute, together with a bias circuit 15, a constant current source circuit. Current mirror circuits 19 and 20 are supplied with control currents $I_0$ available from the constant current source circuit, so that equal forward currents $I_0$ are caused to flow through diode-connected transistors $Q_1$ and $Q_2$ respectively. Control current $(I_1+I_2)$ which flows in the bias circuit 15 is similar to that in the embodiment shown in FIG. 7.

Referring to FIG. 9, there is shown the variable impedance circuit according to a seventh embodiment of the present invention, which includes a current mirror circuit 16 comprising transistors $Q_{27}$ to $Q_{29}$; a current mirror circuit 17 comprising transistors $Q_{15}$ to $Q_{19}$; and a current mirror circuit 18 comprising transistors $Q_4$, $Q_{25}$ and $Q_{26}$.

A signal voltage $e_0$ supplied via an input terminal 11 is rectified in a rectifier circuit 12, and thus a control voltage $e_1$ is obtained through a buffer circuit 13. When the level of a bias voltage obtained by means of divider resistors $R_1$ and $R_2$ is not high enough to turn on a transistor $Q_{22}$, a current $I_2$ (equal to $e_1/R_3$) flowing through a resistor $R_3$ flows in the current mirror circuit 16. The current $I_2$ is also caused to flow as forward current of diode-connected transistors $Q_1$ and $Q_2$ through the current mirror circuit 17 and 18. A current $2I_0$ is caused to flow through the current source transistor $Q_4$. When the control voltage $e_1$ builds up so that the transistor $Q_{22}$ is turned on, this transistor $Q_{22}$ draws in, as collector current, the current $I_1$ from the current mirror circuit 17. Consequently, a control current ($I_1+I_2$) is caused to flow through the current mirror circuit 17, whereby the forward current $I_0$ is controlled. In this way, such a V-I characteristic as shown by the curve c in FIG. 6, is achieved. Thus, it is possible to make variable the impedance of the variable impedance circuit even when the power source voltage is as low as 1.8 V or less. By using such a concept, it is possible to achieve any desired V-I characteristic so that the extent of impedance variation can freely be set.

As will be appreciated from the foregoing discussion, with the variable impedance circuit according to the present invention, forward currents that flow through the impedance elements formed by a pair of diode-connected transistors or diodes are maintained to be equal to each other by the use of current mirror circuits, so that the impedance between the terminals 1 and 2 can be varied. By controlling the forward currents in this way, the d.c. level when the impedance is varied, is stabilized so that there occurs no distortion due to potential difference between the terminals 1 and 2 of the variable impedance circuit. Thus, by employing the variable impedance circuit of the present invention with an audio signal processing system for a radio receiver or the like, for example, the problem of pop noise occurrence can most effectively be avoided.

The variable impedance circuit according to the present invention is also advantageous in that the same can be comprised of elements that are well adapted to be fabricated in the form of a semiconductor integrated circuit.

A further advantage is that the present variable impedance circuit can readily be programmed in terms of its impedance varying range by virtue of the fact that forward currents that flow through the impedance elements formed by transistors or diodes are supplied through current mirror circuits and thus can easily be set.

A still further advantage is that the impedance can be varied even with a power source voltage as low as about 1.8 V.

While the present invention has been described and illustrated with respect to some specific embodiments thereof, it is to be understood that the present invention is by no means limited thereto but covers all changes and modifications which will become possible within the scope of the appended claims.

What is claimed is:
1. A variable impedance circuit, comprising:
   a pair of diodes connected with each other;
   a first current source circuit coupled to the connection point between said diodes;
   a second and a third current source circuit connected to the anodes of said diodes respectively;
   terminals provided at the anode sides of said diodes respectively so that a variable impedance element is established therebetween;
   a first current mirror circuit for equally controlling forward currents flowing from said second and third current source circuits to said diodes respectively;
   a second current mirror circuit for flowing, through said first current source circuit, a current substantially equal to the sum of the forward currents flowing out of said second and third current source circuits;
   a transistor driven with a control voltage higher than a predetermined level to draw in a current from said first current mirror circuit; and
   a third current mirror circuit driven with a control voltage lower than a predetermined level to draw in a current from said first current mirror circuit;
   wherein currents derived from said transistor and said third current mirror circuit are caused to flow, through said first current mirror circuit, in said pair of diodes as equal forward currents, thereby making variable the impedance between said terminals.
2. A variable impedance circuit according to claim 1, wherein said pair of diodes are constituted by diode-connected transistors.

* * * * *